United States Patent
Chen et al.

(10) Patent No.: US 7,098,523 B2
(45) Date of Patent: Aug. 29, 2006

(54) CONTROLLED LEAKAGE CMOS DECOUPLING CAPACITOR FOR APPLICATION SPECIFIC INTEGRATED CIRCUIT LIBRARIES

(75) Inventors: David Jia Chen, Endwell, NY (US); Terry C. Coughlin, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 10/732,950

(22) Filed: Dec. 11, 2003

(65) Prior Publication Data

US 2005/0127972 A1   Jun. 16, 2005

(51) Int. Cl.
*H01L 29/00*   (2006.01)
(52) U.S. Cl. ............... 257/533; 257/E27.045
(58) Field of Classification Search ............... 257/532, 257/533, 534, 535, 536, E27.045, 499, 528, 257/E27.025
See application file for complete search history.

(56) References Cited

U.S. PATENT DOCUMENTS

| 5,119,267 A * | 6/1992 | Sano et al. ................. 361/311 |
| 5,598,029 A * | 1/1997 | Suzuki ....................... 257/665 |
| 5,917,230 A * | 6/1999 | Aldrich ...................... 257/532 |
| 6,177,716 B1 * | 1/2001 | Clark ......................... 257/532 |
| 6,365,954 B1 * | 4/2002 | Dasgupta .................... 257/532 |

* cited by examiner

*Primary Examiner*—Lex H. Malsawma
(74) *Attorney, Agent, or Firm*—Shelley M. Beckstrand

(57) ABSTRACT

A decoupling capacitor includes a fixed resistance in series with the capacitor, the resistance formed by contacts connecting a polysilicon layer to metal and a diffusion layer to metal; the contacts being of location and quantity sufficient for limiting defect current while allowing the capacitor to function at high frequency. N pairs of contacts in at least two sets of contacts are separated by a distance K sufficient to achieve a leakage limiting resistance of R and a bandwidth limiting resistance of R/2.

6 Claims, 9 Drawing Sheets

DECOUPLING CAP WITH NFET GATE

DECOUPLING CAP WITH
INTEGRATED RESISTOR

CONTROLLED LEAKAGE CMOS DECOUPLING CAPACITOR FOR APPLICATION SPECIFIC INTEGRATED CIRCUIT LIBRARIES

BACKGROUND OF THE INVENTION

1. Technical Field of the Invention

This invention relates to electronic circuit design. More specifically, it relates to placement of voltage and ground contacts in a decoupling capacitor for application specific integrated circuit (ASIC) libraries.

2. Background Art

Current CMOS technology integrated circuits (ICs) contain millions of logic gates switching at very high speeds. Decoupling capacitors are required across the power supply busses VDD and GND to reduce the switching noise which can affect the timing of the individual gates on the chip. As CMOS technologies have progressed, higher circuit speeds are realized and increased wire resistance results from smaller metal cross sections in the power bussing. Adding larger areas of decoupling capacitors to an IC requires large areas of polysilicon which increase the probability that a single processing defect could cause a short from VDD to Ground in the capacitor area. This would render the entire chip useless and reduce the wafer yield thereby increasing the cost of the functional chips.

Heretofore a first solution has been to add a gating device in series to the decoupling capacitor for two reasons: first, to turn off the leakage path from VDD to Ground for testing purposes; and, second, to gate off the defective device to save the chip should a defect cause a power supply short in the capacitor area.

There are a few drawbacks to the above solution that make implementation difficult, and the usefulness of this approach is bandwidth limited for high speed applications. The gating device is usually an NFET (NFET are typically smaller than PFET for the same Igs current). This NFET is sized such that there is a low impedance from gate-to-source. The low impedance in series with the capacitor is required to reduce the RC which limits the bandwidth of the network. This low impedance NFET must be very large physically which may take up as much area as the capacitor itself. The large NFET must also have a large gate area which increases the gate capacitance, which in turn forces the chip designer to use a large driver to drive the gate. Another draw back is the fact that the decoupling capacitor has an input pin. Ideally a decoupling capacitor is a passive device without any wireable pins. When thousands of decoupling capacitors are required on a chip, thousands of gates must be wired and driven by circuit buffers from one or more primary input pins. The wiring and buffering is further complicated when it is desirable to isolate and degate the defective capacitor. A substantial amount of circuit area and wireability is lost when implementing such schemes.

A second solution has involved the addition of an integrated circuit resistor, resulting in a capacitor with a large RC. This solution also results in a relatively large area requirement for the resistor.

It is understood that coupled noise and leakage are driving down circuit yields. This is cause by highly resistive and closely spaced circuit wiring (coupled noise) and extremely thin gate oxides causing current leakage. A large RC means that the capacitor can not function as a decoupling capacitor, or has limited affect as a decoupling capacitor. On the other hand, a low series resistance capacitor allows more leakage current. Consequently, there is a need in the art for a decoupling capacitor the limits leakage current by design without adding a resistor in series.

Such decoupling capacitors as gated capacitors, capacitors with series resistance of a chosen resistance, and a series of capacitors pfet/nfet decoupler with NFET drain tied to PFET gate and Pfet drain tied to NFET gate which have previously done well at high-frequency decoupling have not performed successfully in newer technologies due to their large series resistance Referring to FIGS. 1 and 2, the first solution described above uses a gating transistor TN2 102 that can be turned on or off by switching the input GATE 104 high or low. When turned off, such as during test, gate 102 is open. The leakage current through the capacitor CAP1 106 from VDD 110 to GND 108 is limited by the size of gating transistor TN2 102 when TN2 is on. This approach requires a very large device TN2 102, a buffer TN1 112 and TP1 114 and an input pin 100 for gate 104, all added to the layout of capacitor CAP1 106.

Referring to FIG. 3, the second solution described above uses an integrated circuit resistor R1 116 added in series to capacitor CAP1 106. Referring to FIG. 4, this solution requires the area overhead of the integrated circuit resistor 116, which reduces the layout density of decoupling capacitor CAP1 106 considerably.

SUMMARY OF THE INVENTION

A decoupling capacitor includes a fixed resistance in series with the capacitor, the resistance formed by contacts connecting a polysilicon layer to metal and a diffusion layer to metal; the contacts being of location and quantity sufficient for limiting defect current while allowing the capacitor to function at high frequency.

Other features and advantages of this invention will become apparent from the following detailed description of the presently preferred embodiment of the invention, taken in conjunction with the accompanying drawings.

BEST MODE FOR CARRYING OUT THE INVENTION

The present invention solves problems associated with prior art approaches by replacing the gating device with a controlled resistance between the capacitor and ground. The resistance is small enough to allow the RC of the decoupling capacitor to be useful for high frequency and large enough to limit the current due to a short circuit caused by a defect.

In accordance with the invention, a decoupling capacitor that has a fixed resistance in series with the capacitor is formed by contacts connecting polysilicon to metal and diffusion to metal. The location and quantity of these contacts serve to limit the leakage or defect current and at the same time allow the decoupling capacitor to function at high frequency. The absence of an additional integrated circuit resistor or MOS device to limit current reduces the area of the device considerably. A control pin for the gating function is no longer necessary, which allows more freedom of placement without any of the wiring overhead of the prior solutions.

Figure 1:
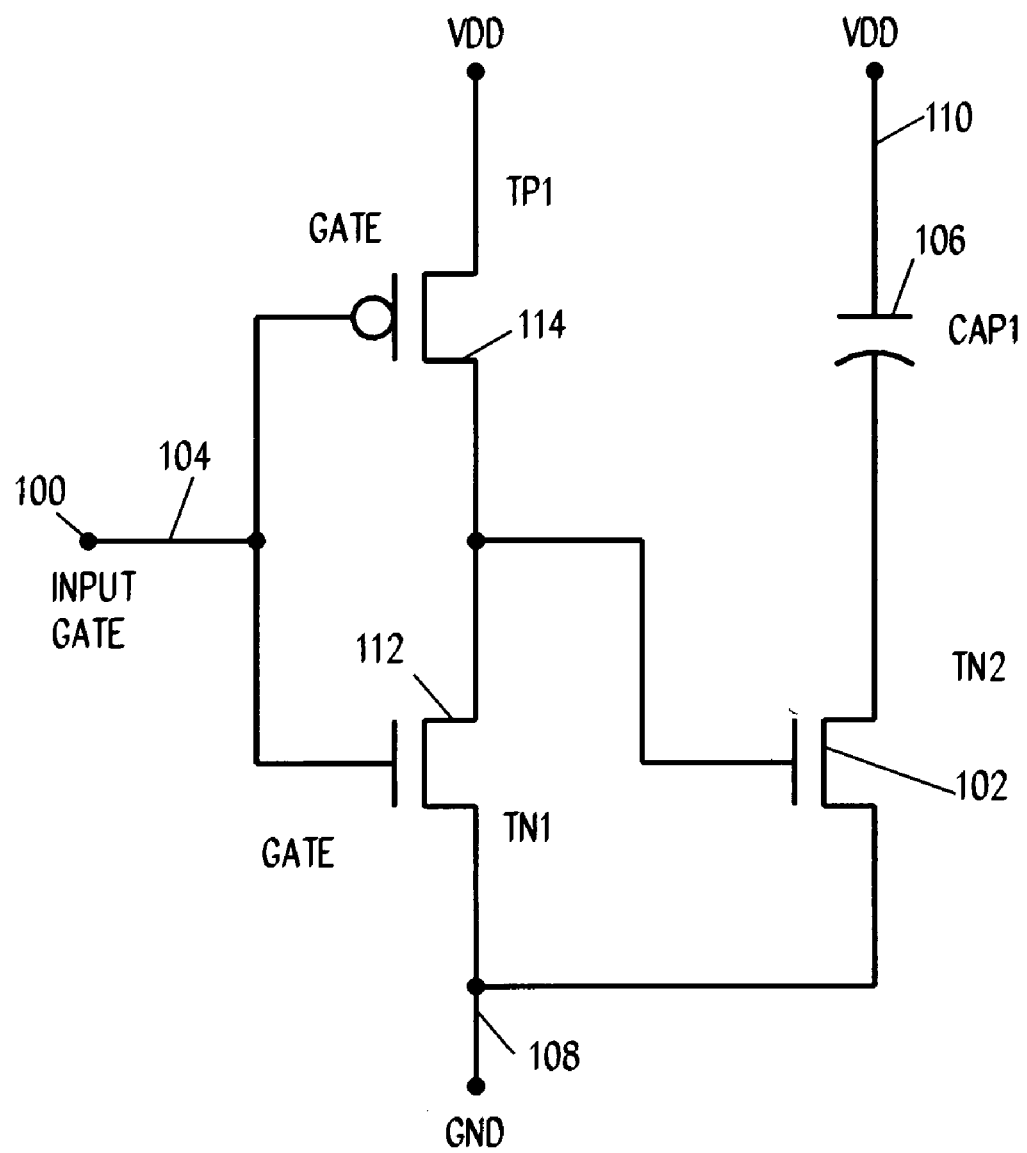
FIG. 1 is a schematic representation of a decoupling capacitor with NFET gate.
Figure 2:
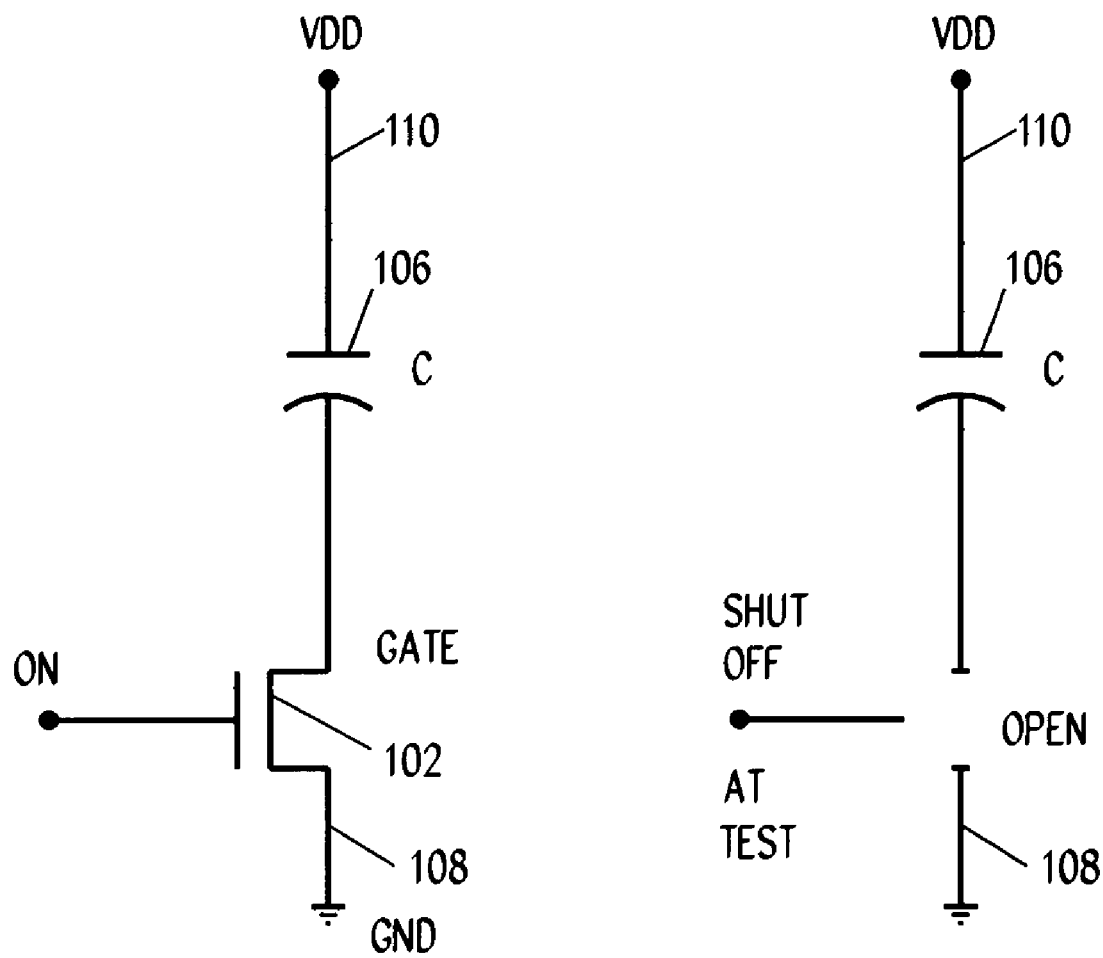
FIG. 2 is a schematic representation of a portion of the decoupling capacitor of FIG. 1, showing on and off states.
Figure 3:
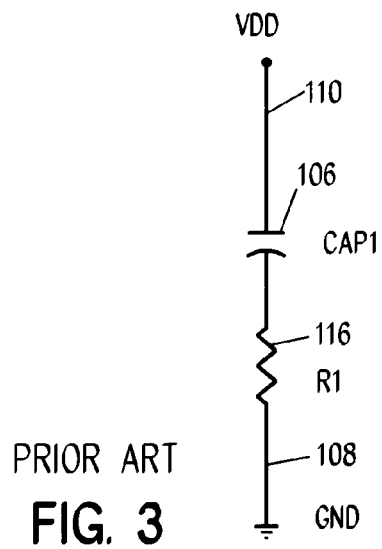
FIG. 3 is a schematic representation of a decoupling capacitor with integrated resistor.
Figure 5:
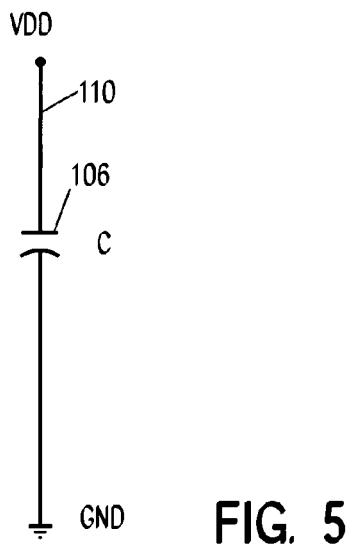
FIG. 5 is a schematic representation of the decoupling capacitor of the present invention.
Figure 4:
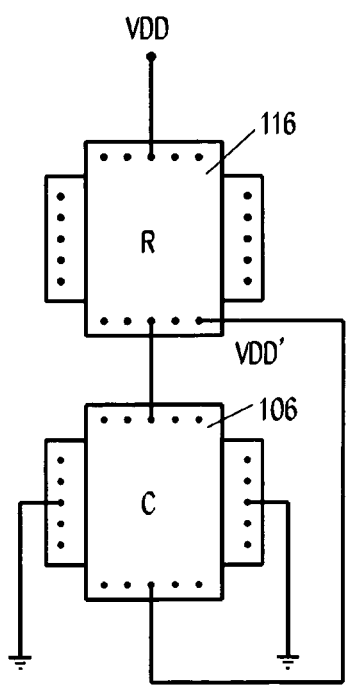
FIG. 4 is a schematic representation of the structure of the decoupling capacitor of FIG. 3.
Figure 6:
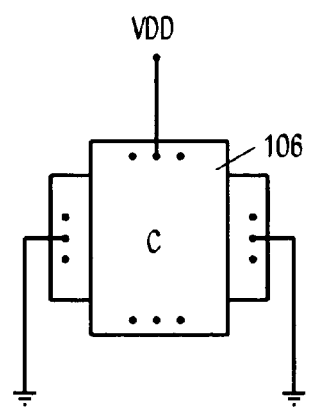
FIG. 6 is a layout representation of the structure of the decoupling capacitor of FIG. 5.

Referring to FIGS. 5 and 6, a schematic representation of the present invention is similar to that of FIGS. 3 and 4, respectively, but does not require the additional integrated circuit resistor R1 116 shown in FIG. 3. In a sense, the present invention may be viewed as providing a way to remove resister R1.

Of course, there still is resistance in the path from Vdd—Capacitor—Gnd, due in a measure to the number of contacts. However, as will be described hereafter, the contact resistance to voltage and to ground ($R_{CA\ VDD}+R_{CA\ GND}$) is not the limiting factor. Under these conditions, a defect shorting the polysilicon gate to the substrate forces the current to travel from the Vdd contact through a section of the substrate, then up to the polysilicon through the defect, and finally along the rest of the polysilicon gate to the ground contact. The resistance of that path is used to limit any defect leakage current, and does so without the addition of a resistor element 116 to the package, or layout. Removing that resistor 116 from the layout means that a much denser capacitor layout may be achieved. Also, the removal of resistor 116, which typically is quite large, reduces the overall RC, resulting in a decoupling capacitor (decap) with a higher bandwidth compared to prior art designs. This is important with technology pushing towards higher frequency circuits. The present invention achieves decoupling using a capacitor that operates over a higher bandwidth due to the smaller series resistance.

Figure 7:
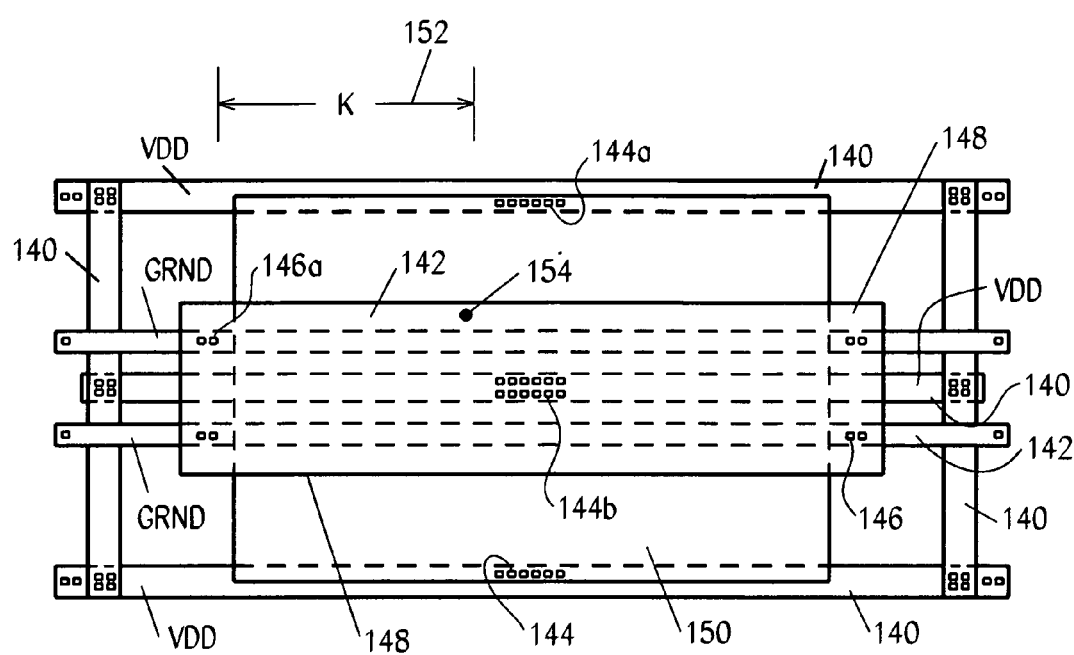
FIG. 7 is a layout representation of the structure of the decoupling capacitor of the present invention.

Referring to FIG. 7, more detailed schematic representation of the present invention is presented. Two plates 148, 150 form a capacitor, with a first voltage (ground) on top plate 148 (the polysilicon layer) and a second voltage (Vdd) on bottom plate 150 (the diffusion layer). With very thin oxide, current may leak through the capacitor. The layout in FIG. 7 is that of a decoupling capacitor that limits leakage current by the number and location of contacts 144, 146. Current flow from the VDD straps 140 located at the top and bottom of the cell to the ground straps 142 located in the middle of the cell is limited by the number of contacts connecting diffusion to VDD and polysilicon to GND. A statistical analysis of the contact resistance may be used to determine the minimum and maximum resistance per contact. The total resistance required is composed of the series/parallel combination contacts equivalent to the desired value. The desired minimum resistance sets the maximum leakage current and the desired maximum resistance sets the overall RC of the decoupling capacitor which will limit the bandwidth or response of the RC network. The resistance target is broken down into a number of contacts that connect the polysilicon to the GND bus and the diffusion to the VDD buss providing many parallel paths for current to flow while limiting the current to a maximum value and limiting the bandwidth to the maximum value.

Alternatively, the contacts may be distributed evenly along the polysilicon and the diffusion contacts placed on the opposite end of the capacitor. However, the illustrated layout utilizes the VDD straps that are part of a background image (meaning the VDD straps are there no matter what the circuit is) to keep wiring tracks free. This makes placement of the capacitor easier since it is easy to wire circuits on the left of the capacitor to the circuits on the right should the need arise.

The placement of the GND contacts to VDD contacts is spread as far apart as possible (distance K 152) to force leakage current through polysilicon and diffusion which further limit the current due to the polysilicon and diffusion resistance. Together the total resistance in series for leakage is (where CA means "contact" and RX means "diffusion"):

$$R_{leak}=R_{CA\ VDD}+R_{RX\ avg}+R_{PC\ avg}+R_{CA\ GND} \qquad (1)$$

The contact resistance should play a very small role in the equation above because the contact resistance can vary widely. To say that the leakage resistance can be limited by only placing one contact on the polysilicon layer and one contact on the diffusion layer would be a poor design choice. The contact resistance can vary such that the total leakage resistance is much smaller than expected, or the contact resistance can be so large that the design is no longer an effective decoupling capacitor. If the contact resistance is too large, the charge needed to stabilize the GND and VDD fluctuations, for example due to circuit switching, might not be able to move from the plate to the power rails quickly.

The contacts and the resistance they contribute play a very small role in leakage resistance. Consequently, where contacts are placed determines control on leakage. The contact resistance is relatively minor in comparison with the total resistance along the described path. An optimal design requires that enough contacts be provided to assure good connection between the plates of the capacitor and the Vdd/Gnd buses, and putting as many contacts as available space permits (as will be described hereafter) all but takes the contact resistance out of the equation.

The worst case scenario would be where something causes the Vdd and Gnd plates to short together at defect site 154. However, the above equation holds true even for general leakage due to charge tunneling through the thin oxide—that charge still has to travel along the two plates 148, 150 and will see the same resistance.

Supposing that a resistor of 35 ohms is included in the VDD—capactitor—resistor-ground layout to limit the leakage in the event of a defect. That 35 ohm resistor is there whether or not there is a leakage problem, and it will serve as a bandwidth limiting resistance. In an exemplary embodiment of the invention, any leakage current will see roughly 35 ohms. But in normal operation only half that resistance exists. An added bonus is that without the gating device 102 or an actual added resistor 116 the layout realizes a higher capacitance density.

Figure 8:
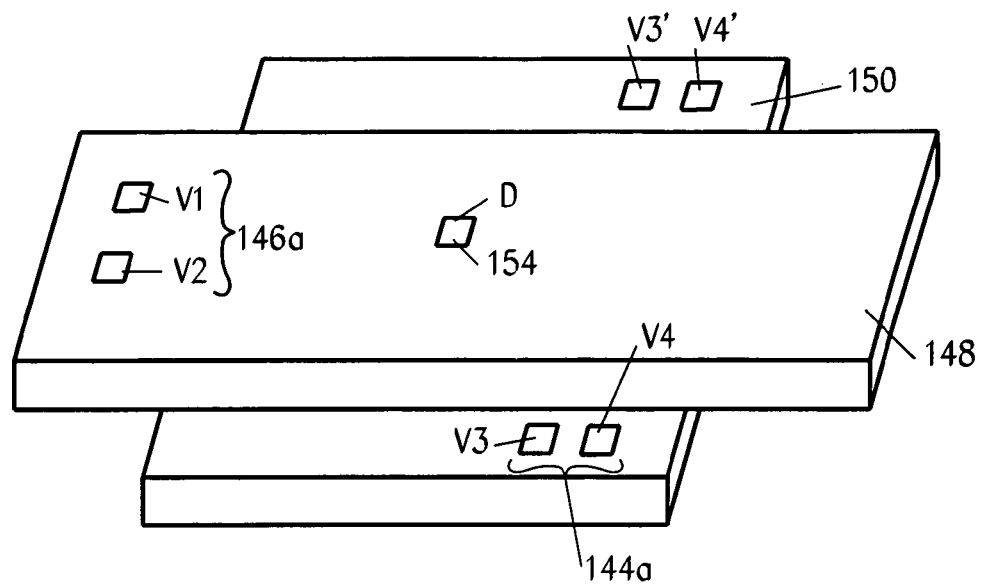
FIG. 8 is a schematic representation of a decoupling capacitor, simplified to support illustration of the RC circuit of FIG. 9.
Figure 9:
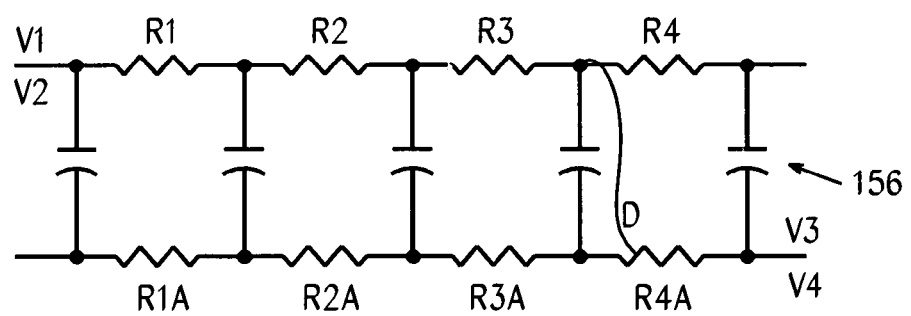
FIG. 9 is a schematic representation of the resultant capacitor of FIG. 8 shown as a distributed RC circuit.

Referring to FIGS. 8 and 9, a schematic representation of the invention includes polysilicon and diffusion plates 150, 148, respectively, or visa versa, V1 and V2 146a are contacts to a first supply and V3 and V4 144a are contacts to a second supply, as are also contacts V3' and V4'. D 154 is a defect, a short between the first plate 150 and second plate 148.

FIG. 9 illustrates a model of the resultant capacitor as a distributed RC chain, showing defect D 154 in the schematic. If D 154 exists, there is a resistance between the two supplies that is:

$$(Rv1\|Rv2)+R1+R2+R3+R4A+(Rv3\|Rv4) \quad (2)$$

where $\|$ means "in parallel with".

Letting all R's be R and ignoring the small contact resistance, the result of equation (2) is 4*R. In terms of frequency response (now assuming no defect 145) at infinite frequency, all the capacitors 156 become shorts. The series resistance is:

$$(Rv1\|Rv2)+(R1\|R1A)+(R2\|R2A)+(R3\|R3A)+\\(R4\|R4A)+(Rv3\|Rv4) \quad (3)$$

Again letting all the R's be R and ignoring the small contact resistors, the series resistance is simply 4*R/2 (in the example), that is 2*R. The leakage limiting resistance is 4*R while the bandwidth limiting resistance is only 2*R while a design using a separate series resistor would show the same leakage and bandwidth limiting resistance.

Figure 10:
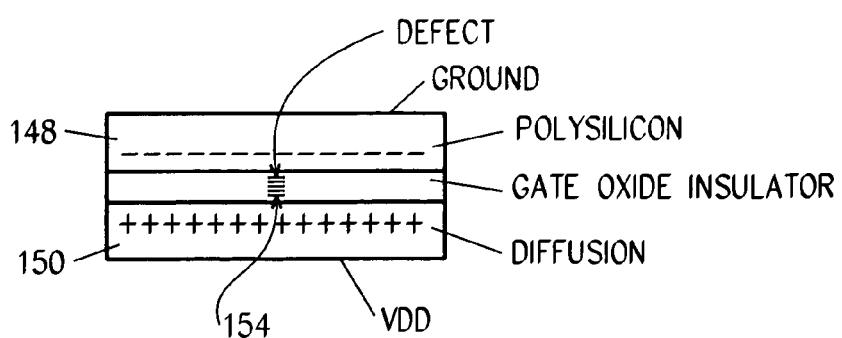
FIG. 10 illustrates a defect site in the insulation layer of an electronic package.

Referring to FIG. 10, in a typical package, diffusion layer 150 and polysilicon layer 148 provide a capacitor across the gate oxide insulation layer between ground and voltage. Defect 154 occurs in the gate oxide layer, in effect shorting the ground and voltage plates.

Figure 11:
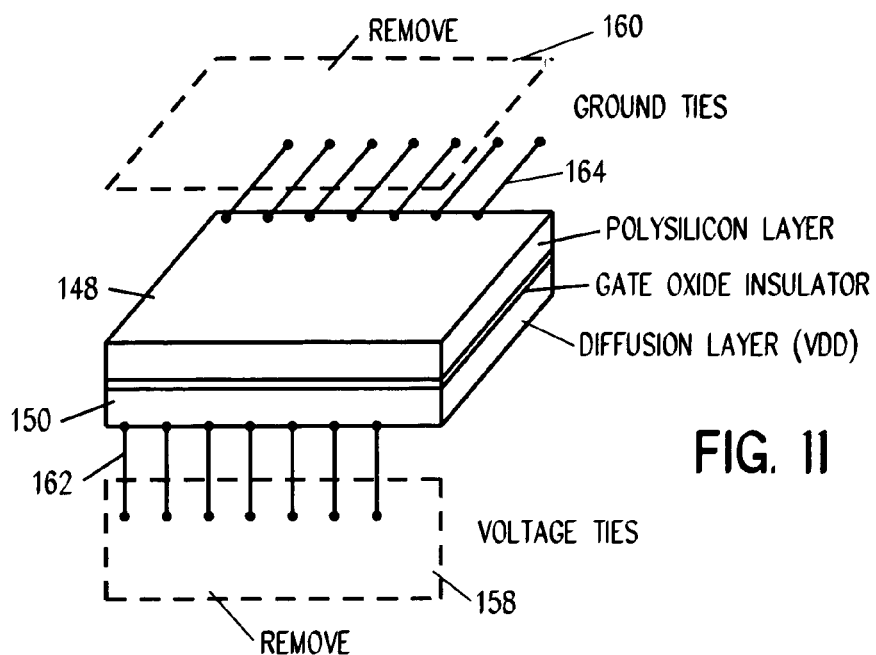
FIG. 11 illustrates typical circuit ties for the electronic package of FIG. 10.

Referring to FIG. 11, typically a large plurality of voltage ties 158, 162 tie Vdd layer 150 to voltage, and a large plurality of ground ties 160, 164 tied the polysilicon layer 148 to ground.

Figure 12:
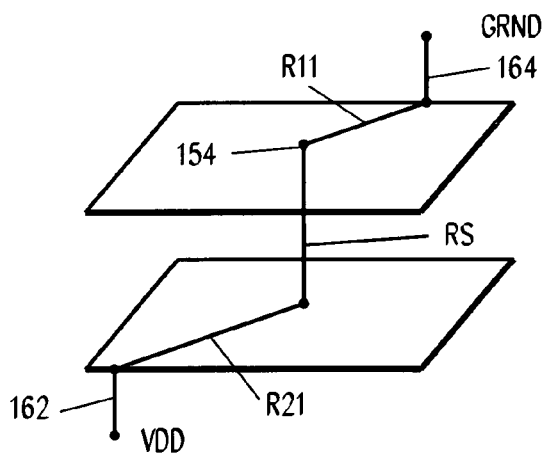
FIG. 12 illustrates the package of FIG. 10 modified in accordance with the present invention to establish surface resistance as the dominant factor between voltage and ground in the presence of a defect.

Referring to FIG. 12, the present invention achieves an improved package by, in effect, removing ties 158 and 160, leaving a much smaller and strategically positioned number of voltage contacts, or ties, 162 and ground ties 164. (One each is shown, but there will be as many as a selected site allows). Thus, sites for voltage ties 162 and ground ties 164 are selected so as to maximize resistance paths R11 and R21 through any possible failure site 154, forcing current through defect 154 to pass from Vdd 162 to Gnd 164 through diffusion resistance R11 and R21. The resulting series resistance is R11+RS+R21.

Figure 13:
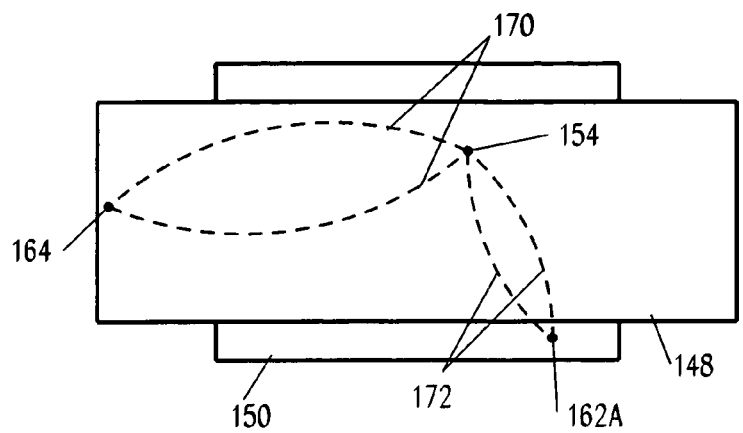
FIGS. 13 and 14 illustrate patterns of surface current between voltage and ground planes in a package with a defect.
Figure 14:
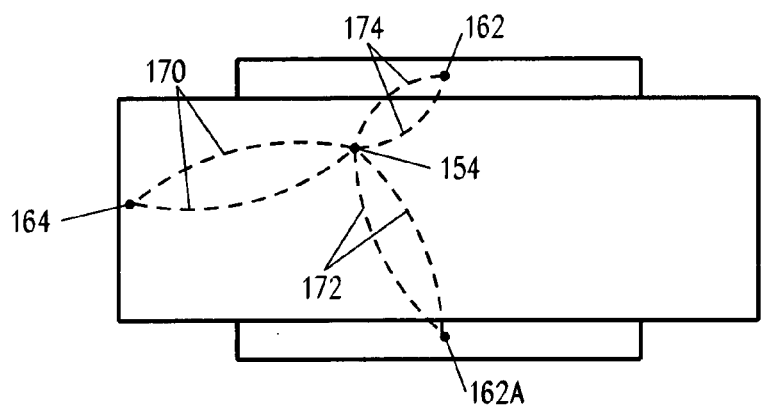

As illustrated in FIGS. 13 and 14, the current flow from defect 154 to ground contacts 164 moves across the surface of the polysilicon layer 148, current 172, 174 flows to defect 154 from contacts 162a, 162, respectively in diffusion layer 150.

Figure 15:
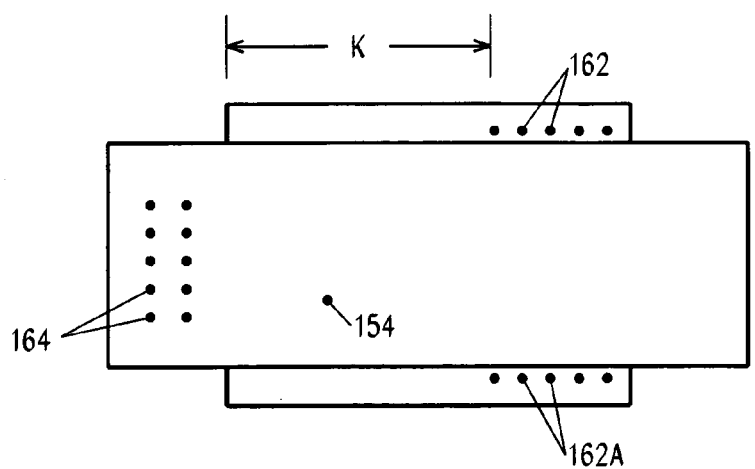
FIG. 15 illustrates the dimension K of the present invention for assuring that surface resistance is the dominant factor between voltage and ground in the presence of a defect.

Referring to FIG. 15, in accordance with the present invention, sites 164 and 162, or sites 164 and sites 162, 162a, are selected so as to maximize the distance K, thereby maximizing the sum of paths 170+172/174 to assure the maximum possible sheet resistance R11+R21 through any defect site 154. The number of contacts at sites 164 and 162 and/or 162a is selected to be the maximum allowed a contact site. The site available for contacts 164 is provided by the extension of polysilicon plate beyond the polysilicon/diffusion overlap. The space available for contacts 162 site is the extension of the diffusion plate beyond the polysilicon/diffusion overlay which is separated from site 164 by at least distance K. This number of contacts 162, 164 is technology dependent, but selected such that the total contact resistance R is much less (by about 1/10) than combined sheet resistance of diffusion and polysilicon layers across distance K.

In the above described embodiment of the invention, the VDD bus is tied to the diffusion (bottom plate) and the GND bus is tied to the polysilicon (top plate). This is the preferred embodiment when using a large PFET to create the capacitor. In current technology, the pcap design gives a higher density layout (i.e. capacitance/layout area) than an NFET design. However, in an alternative embodiment, the present invention also applies to an NFET design where the polysilicon is tied to the VDD and diffusion is tied to GND.

Figure 16:
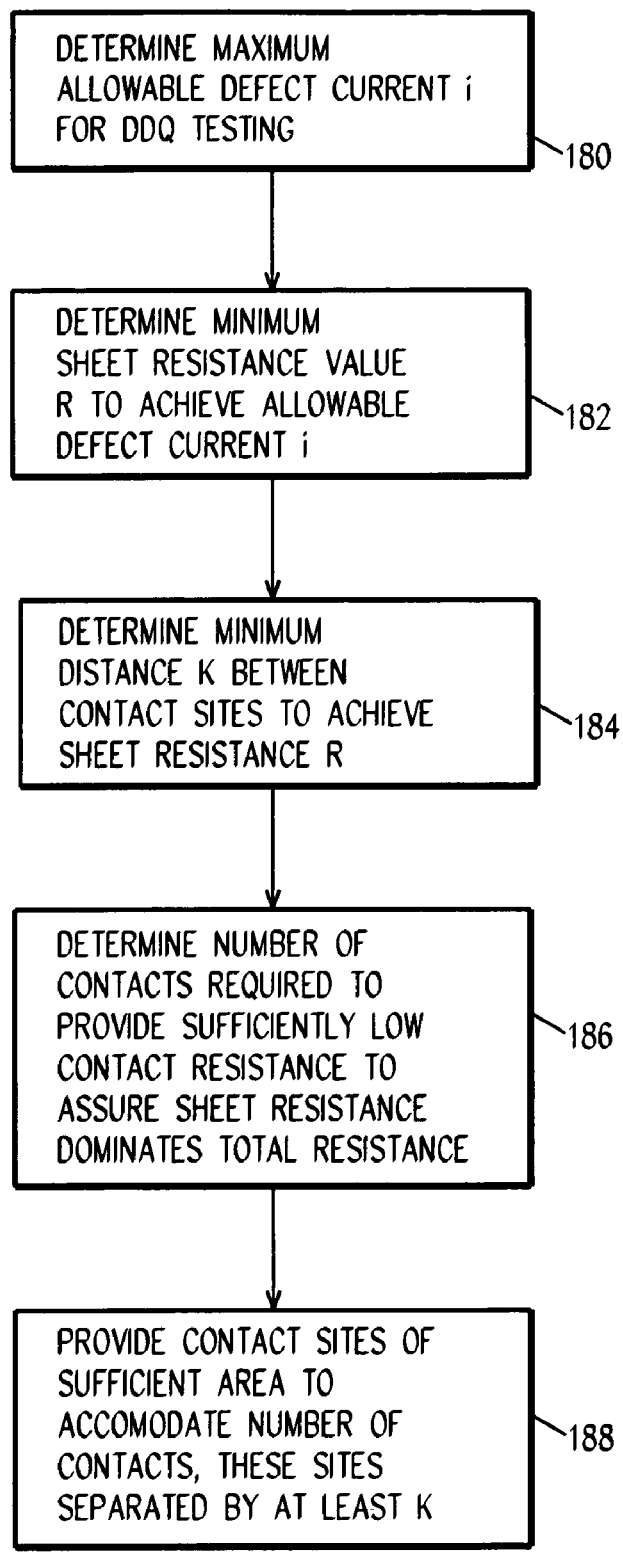
FIG. 16 is flow chart illustrating the steps of a method in accordance with the present invention for determining contact site placement and number of contacts in an electronic package.

Referring to FIG. 16, a method for determining the number and position of contacts is to calculate in step 182 the minimum sheet resistance value R determined in step 180 that is needed to limit defect current to an amount which allows IDDQ testing, and in step 184 use that R value to determine the distance K between contacts 164, 162. IDDQ is basically the DC current of the circuit while nothing is switching. Assuming that ½ of R is in the polysilicon layer and ½ in the diffusion layer, for a give sheet resistance, in step 186, the number of contacts N needed to provide a sufficiently low contact resistance to assure that sheet resistance dominates is determined, and in step 188 contact sites are designed of sufficient area and distance K to provide for placement of N contacts. Defect current and frequency specifications depend on the technology and the application for the circuit. In general, such specifications are set so as to allow IDDQ testing and achieve stable busses by suppressing, substantially limiting or eliminating noise on the Vdd and ground busses.

ALTERNATIVE EMBODIMENTS

Figure 17:
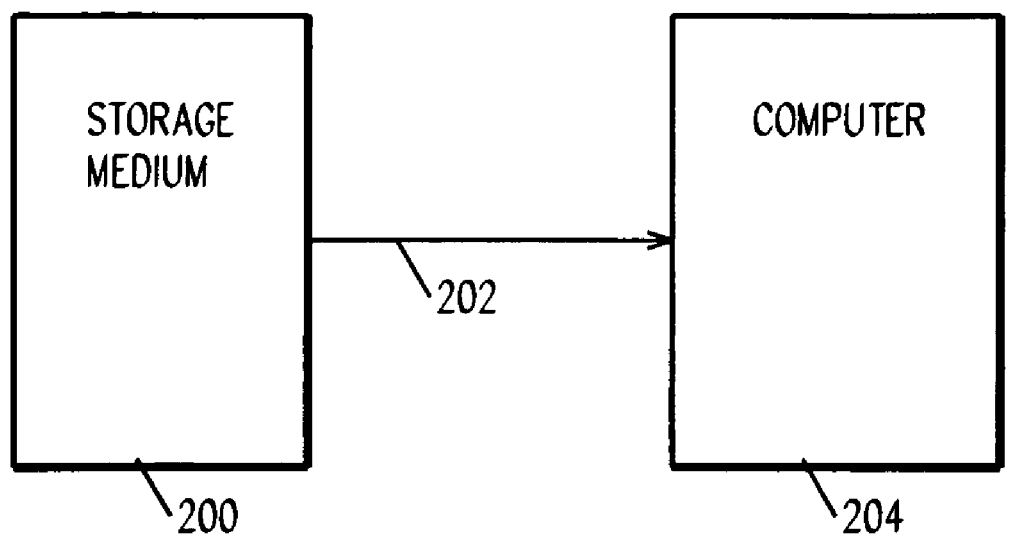
FIG. 17 is a high level system diagram illustrating a program storage device readable by a machine, tangibly embodying a program of instructions executable by a machine to perform method steps for determining contact site placement and number of contacts in an electronic package.

It will be appreciated that, although specific embodiments of the invention have been described herein for purposes of illustration, various modifications may be made without departing from the spirit and scope of the invention. Referring to FIG. 17, in particular, it is within the scope of the invention to provide a computer program product or program element, or a program storage or memory device 200 such as a solid or fluid transmission medium, magnetic or optical wire, tape or disc, or the like, for storing signals readable by a machine as is illustrated by line 202, for controlling the operation of a computer 204, such as a host system or storage controller, according to the method of the invention and/or to structure its components in accordance with the system of the invention.

Further, each step of the method may be executed on any general purpose computer, such as IBM Systems designated as zSeries, iSeries, xSeries, and pSeries, or the like and pursuant to one or more, or a part of one or more, program elements, modules or objects generated from any programming language, such as C++, Java, Pl/1, Fortran or the like.

And still further, each said step, or a file or object or the like implementing each said step, may be executed by special purpose hardware or a circuit module designed for that purpose.

Accordingly, the scope of protection of this invention is limited only by the following claims and their equivalents.

We claim:

1. A decoupling capacitor, comprising:
   a fixed resistance in series with said capacitor, said capacitor formed by a polysilicon layer and a diffusion layer, the diffusion layer formed in a substrate, said fixed resistance formed by a plurality of contacts connecting one end only of said polysilicon layer to a first voltage level buss and a plurality of contacts connecting said diffusion layer to a second voltage level buss only along the end of said capacitor opposite that of said polysilicon layer; and
   said contacts being of location and capacity for protecting surrounding circuits in the event there is a defect shorting said busses together by limiting defect current while allowing said capacitor to function at a frequency sufficiently high to suppress noise on said first and second busses to a value which achieves bus stability.

2. The decoupling capacitor of claim 1, further comprising:
   said contacts including a first set of contacts to a first voltage and a second set of contacts to a second voltage;
   a defect leakage current limiting path including said first set and said second sets of contacts separated by a distance optimized to cause a defect shorting said polysilicon layer to said substrate to force defect current to travel from said first set of contacts through a section of the substrate, through a section of said diffusion layer, then to the polysilicon through the defect, and then along the rest of the polysilicon layer to said second set of contacts.

3. The decoupling capacitor of claim 2, further comprising:
   said first set of contacts and said second set of contacts determined in number and location to provide preselected minimum and maximum resistance values between said first and second sets of contacts, said minimum resistance value for achieving a preselected maximum leakage current through any defect site in said polysilicon layer, and said maximum resistance value for achieving a preselected overall decoupling RC factor sufficient for a minimum RC network bandwidth.

4. The, decoupling capacitor of claim 3, further comprising providing said first and second sets of contacts in sufficient number to effectively achieve total contact resistance leas than 10% of combined sheet resistance of said diffusion and polysilicon layers across a distance separating said first and second sets of contacts.

5. The decoupling capacitor of claim 2, further comprising providing N pairs of contacts in said sets of contacts and placing said first and second sets of contacts separated by a distance K sufficient to achieve a leakage limiting resistance of R and a bandwidth limiting resistance of R/2.

6. The decoupling capacitor of claim 2, further comprising providing a technology-dependent number of contacts selected in number sufficient to achieve total contact resistance less than 10% of combined sheet resistance of said diffusion and polysilicon layers across a distance separating said first and second sets of contacts.

* * * * *